United States Patent
Takeda et al.

(10) Patent No.: US 11,555,990 B2
(45) Date of Patent: Jan. 17, 2023

(54) LASER RADAR

(71) Applicant: Panasonic Intellectual Property Management Co., Ltd., Osaka (JP)

(72) Inventors: Eiji Takeda, Osaka (JP); Hitoshi Noguchi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 336 days.

(21) Appl. No.: 16/987,367

(22) Filed: Aug. 6, 2020

(65) Prior Publication Data
US 2020/0363511 A1    Nov. 19, 2020

Related U.S. Application Data

(63) Continuation of application No. PCT/JP2018/048174, filed on Dec. 27, 2018.

(30) Foreign Application Priority Data

Mar. 8, 2018    (JP) .............................. JP2018-042384

(51) Int. Cl.
| | | |
|---|---|---|
| G02B 19/00 | (2006.01) | |
| G01S 7/481 | (2006.01) | |
| G02B 26/10 | (2006.01) | |
| G01S 17/931 | (2020.01) | |
| H01S 5/00 | (2006.01) | |

(52) U.S. Cl.
CPC ........ G02B 19/0057 (2013.01); G01S 7/4813 (2013.01); G01S 7/4817 (2013.01); G02B 26/10 (2013.01); *G01S 17/931* (2020.01); *H01S 5/005* (2013.01)

(58) Field of Classification Search
CPC ...... G01S 7/4815; G01S 7/4817; G01S 7/481; G01S 7/4814; G01S 7/4813; G01S 17/931; G02B 26/10; H01S 5/005
See application file for complete search history.

(56) References Cited

U.S. PATENT DOCUMENTS

| | | |
|---|---|---|
| 2018/0038958 A1 | 2/2018 | Kawazoe et al. |
| 2019/0025409 A1 | 1/2019 | Kawazoe et al. |

FOREIGN PATENT DOCUMENTS

| | | |
|---|---|---|
| JP | S62-272104 A | 11/1987 |
| JP | H04-242215 A | 8/1992 |
| JP | H07-306260 A | 11/1995 |

(Continued)

OTHER PUBLICATIONS

International Search Report issued in corresponding International Patent Application No. PCT/JP2018/048174, dated Apr. 9, 2019, with English translation.

*Primary Examiner* — Luke D Ratcliffe

(74) *Attorney, Agent, or Firm* — McDermott Will & Emery LLP

(57) ABSTRACT

A laser radar includes: a light source including a laser diode; an optical system configured to shape laser light emitted from the laser diode, into a line beam that is long in one direction, and project the line beam to a target area; and a scanner configured to perform scanning with the line beam in a short side direction of the line beam. The laser diode is disposed such that a fast axis of the laser diode extends along a direction corresponding to the short side direction of the line beam.

7 Claims, 12 Drawing Sheets

(56) References Cited

FOREIGN PATENT DOCUMENTS

| | | | |
|---|---|---|---|
| JP | 08015412 A * | 1/1996 | |
| JP | H08-015412 A | 1/1996 | |
| JP | 2010-271306 A | 12/2010 | |
| JP | 2016-180624 A | 10/2016 | |
| JP | 2017-150990 A | 8/2017 | |
| WO | WO-0230675 A1 * | 4/2002 | .............. B41J 2/475 |

* cited by examiner

LASER RADAR

CROSS REFERENCE TO RELATED APPLICATION

This application is a continuation of International Application No. PCT/JP2018/048174 filed on Dec. 27, 2018, entitled "LASER RADAR", which claims priority under 35 U.S.C. Section 119 of Japanese Patent Application No. 2018-042384 filed on Mar. 8, 2018, entitled "LASER RADAR". The disclosure of the above applications is incorporated herein by reference.

BACKGROUND OF THE INVENTION

1. Field of the Invention

The present invention relates to a laser radar that detects an object using laser light and that is, for example, suitable to be mounted on a moving body such as a passenger car.

2. Disclosure of Related Art

To date, laser radars that detect objects using laser light have been developed in various fields. For example, in a vehicle-mounted laser radar, laser light is projected from the front of the vehicle, and whether or not an object such as a vehicle exists in front of the vehicle is determined on the basis of the presence/absence of reflected light of the laser light. Moreover, the distance to the object is measured on the basis of the projection timing of the laser light and the reception timing of the reflected light.

Japanese Laid-Open Patent Publication No. 2017-150990 discloses a laser radar device configured to scan a measurement target area with a laser beam two-dimensionally in a horizontal direction and a vertical direction and generate three-dimensional information of the measurement target area.

The configuration in which the detection target area is scanned with the laser beam two-dimensionally as described in Japanese Laid-Open Patent Publication No. 2017-150990 has a problem that a frame rate for acquiring information for one frame is significantly reduced due to increase of resolution at measurement positions.

As a method for solving this problem, a method of performing scanning with an elongated line beam having a length corresponding to the width of the measurement target area, in the short side direction of the line beam, can be used. However, in this method, since the line beam is projected to the detection target area while spreading in the long side direction thereof, the energy density of the line beam decreases as the distance to the measurement target area increases. Therefore, in order to detect an object at a longer distance, it is necessary to project the line beam to the detection target area such that the energy density in the short side direction of the line beam does not decrease as much as possible.

SUMMARY OF THE INVENTION

A laser radar according to a main aspect of the present invention includes: a laser diode; an optical system configured to shape laser light emitted from the laser diode, into a line beam that is long in one direction, and project the line beam; and a scanner configured to perform scanning with the line beam in a short side direction of the line beam. The laser diode is disposed such that a fast axis of the laser diode extends along a direction corresponding to the short side direction.

In the laser radar according to the aspect, since the laser diode is disposed such that the fast axis, on which optical control is more easily performed, extends along the direction corresponding to the short side direction of the line beam, the beam spread angle in the short side direction of the line beam can be set such that the line beam is closer to parallel light. Therefore, a decrease in the energy density in the short side direction of the line beam can be effectively inhibited, and an object at a longer distance can be detected.

BRIEF DESCRIPTION OF THE DRAWINGS

The above and other objects and new features of the present invention will be fully clarified by the following description of the embodiment, when read in conjunction with accompanying drawings.

It should be noted that the drawings are solely for description and do not limit the scope of the present invention by any degree.

DESCRIPTION OF THE PREFERRED EMBODIMENTS

Hereinafter, an embodiment of the present invention will be described with reference to the drawings. For convenience, in each drawing, X, Y, and Z axes that are orthogonal to each other are additionally shown. The X-axis direction and the Y-axis direction are the short side direction and the long side direction of a line beam, respectively, and the Z-axis positive direction is a projection direction in which the line beam is projected.

Figure 1:
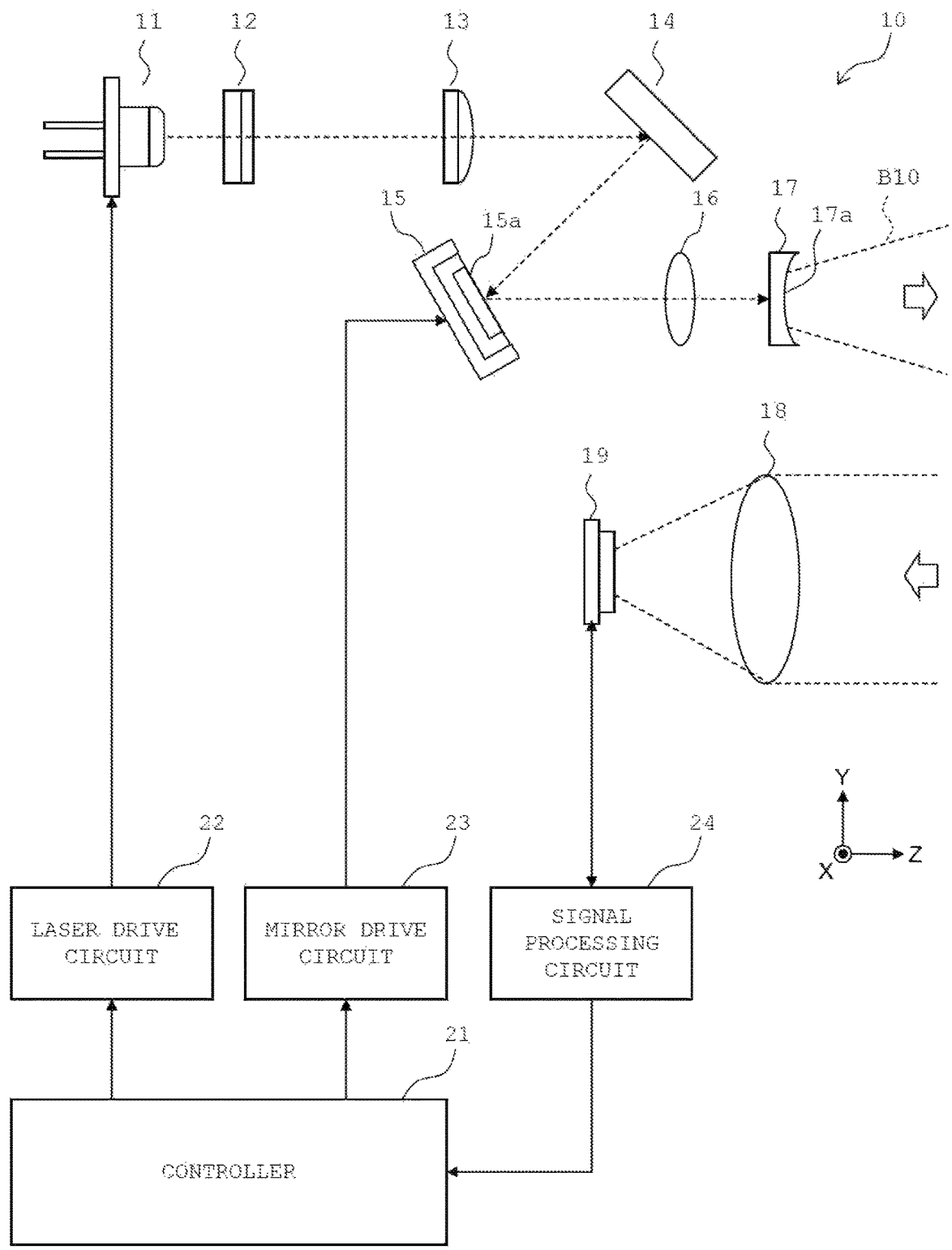
FIG. 1 is a diagram showing the configuration of an optical system and a circuitry of a laser radar according to an embodiment.

FIG. 1 is a diagram showing the configuration of an optical system and a circuitry of a laser radar 10.

The laser radar 10 includes a light source 11, collimator lenses 12 and 13, a mirror 14, a scanner 15, an adjusting lens 16, a magnifying lens 17, a condensing lens 18, and a light receiving element 19 as components of the optical system. A line beam B10 that is long in the Y-axis direction is generated from laser light emitted from the light source 11, by an optical system on the outward path from the light source 11 to the magnifying lens 17.

The light source 11 emits laser light having a predetermined wavelength. The light source 11 is configured by integrating a plurality of laser diodes. In the present embodiment, it is assumed that the laser radar 10 is mounted on a vehicle. Therefore, the emission wavelength of each laser diode is set in the infrared wavelength band (for example, 905 nm). The emission wavelength of each laser diode can be changed as appropriate according to the usage of the laser radar 10.

Figure 2A:
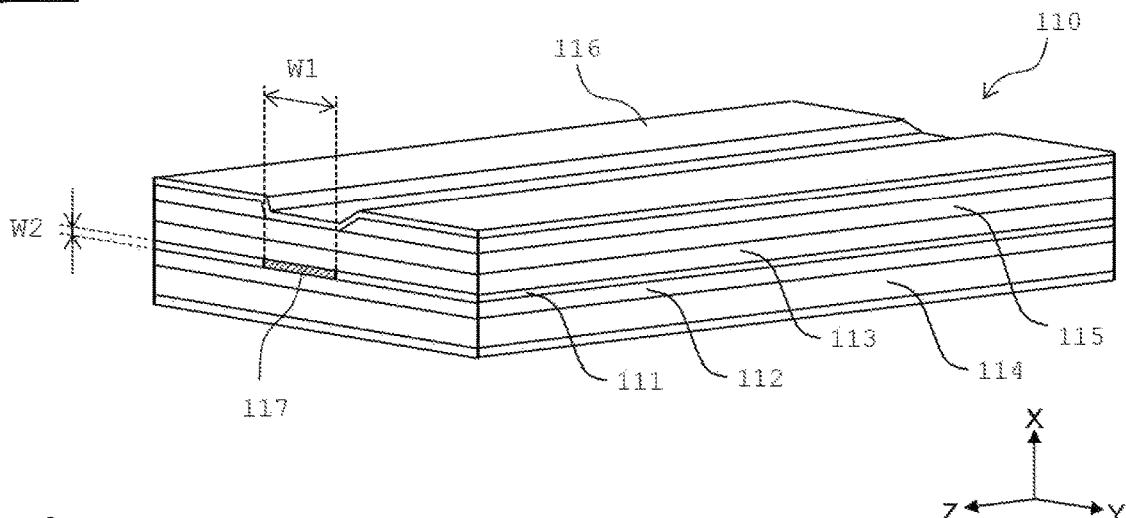
FIG. 2A and FIG. 2B are each a perspective view showing the configuration of a laser diode according to the embodiment.
Figure 2B:
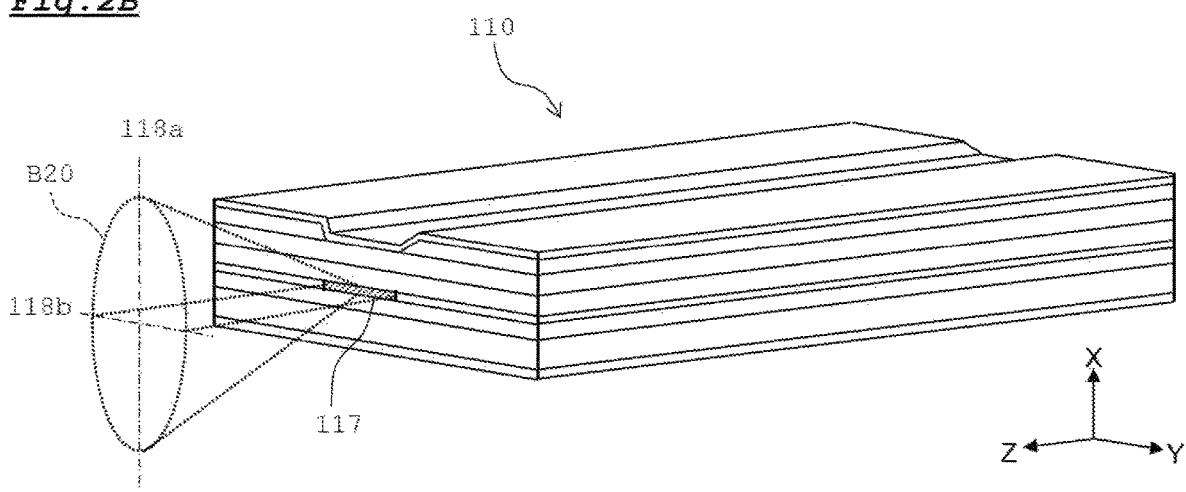
Figure 2C:
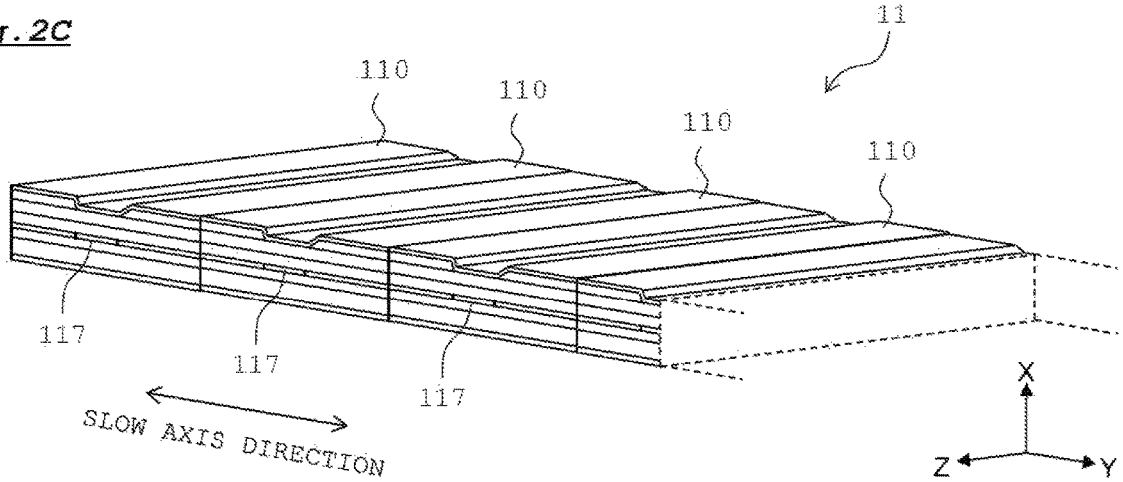
FIG. 2C is a perspective view showing the configuration of a light source of the laser radar according to the embodiment.

FIG. 2A and FIG. 2B are each a perspective view showing the configuration of a laser diode 110, and FIG. 2C is a perspective view showing the configuration of the light source 11.

As shown in FIG. 2A, the laser diode 110 has a structure in which an active layer 111 is interposed between an N-type clad layer 112 and a P-type clad layer 113. The N-type clad layer 112 is laminated on an N-type substrate 114. In addition, a contact layer 115 is laminated on the P-type clad layer 113. When a current is applied to an electrode 116, laser light is emitted from a light emitting portion 117 in the Z-axis positive direction. In general, in the light emitting portion 117, a width W1 in a direction parallel to the active layer 111 is larger than a width W2 in a direction perpendicular to the active layer 111.

An axis in the short side direction of the light emitting portion 117, that is, an axis in the direction (X-axis direction) perpendicular to the active layer 111, is referred to as a fast axis, and an axis in the long side direction of the light emitting portion 117, that is, an axis in the direction (Y-axis direction) parallel to the active layer 111, is referred to as a slow axis. In FIG. 2B, reference character 118a denotes the fast axis, and reference character 118b denotes the slow axis. The laser light emitted from the light emitting portion 117 has a spread angle in the fast axis direction larger than that in the slow axis direction. Thus, a beam B20 has an elliptical shape that is long in the fast axis direction as shown in FIG. 2B.

The intensity distribution (light emission profile) in the fast axis direction of the beam B20 emitted from the light emitting portion 117 has a distribution shape close to that of a single Gaussian distribution, since the width of the light emitting portion 117 in the fast axis direction is narrow. Meanwhile, the intensity distribution (light emission profile) in the slow axis direction of the beam B20 emitted from the light emitting portion 117 has a complicated distribution shape including a plurality of peaks, since the width of the light emitting portion 117 in the slow axis direction is wide. From this, optical control such as reduction of the spread angle of the beam is easier in the fast axis direction than in the slow axis direction, and desired control can be performed more appropriately.

In the present embodiment, as shown in FIG. 2C, a plurality of laser diodes 110 are disposed so as to be aligned along the slow axis, whereby the light source 11 is configured. Therefore, the light emitting portions 117 of the respective laser diodes 110 are disposed in one line in the slow axis direction. Here, each laser diode 110 is disposed such that the fast axis 118a of the light emitting portion 117 is parallel to the direction (X-axis direction) corresponding to the short side direction of the line beam B10 shown in FIG. 1.

In the present embodiment, the plurality of laser diodes 110 forming the light source 11 all have the same emission characteristics. That is, each laser diode 110 emits laser light with the same power when the same drive current is applied thereto.

Referring back to FIG. 1, the collimator lens 12 converges the laser light emitted from each laser diode 110 of the light source 11, in the fast axis direction, and adjusts the spread of the laser light in the fast axis direction to a substantially parallel state. That is, the collimator lens 12 has a function of converting the laser light emitted from each laser diode 110 of the light source 11 into parallel light only in the fast axis direction.

The collimator lens 13 converges the laser light emitted from each laser diode 110 of the light source 11, in the slow axis direction, and sets the spread of the laser light in the slow axis direction to a substantially parallel state. That is, the collimator lens 13 has a function of converting the laser light emitted from each laser diode 110 of the light source 11 into parallel light only in the slow axis direction.

By these two collimator lenses 12 and 13, the laser light emitted from each laser diode 110 of the light source 11 is converted into light spreading substantially parallel over the entire circumference. The light emitting portion 117 is not a perfect point light source. Thus, strictly speaking, a slight misalignment occurs between the optical axes of the collimator lenses 12 and 13 and the light emitting point of the light emitting portion 117 of each laser diode 110. Therefore, the laser light that has passed through the two collimator lenses 12 and 13 does not become perfect parallel light but comes into a state in which the light spreads slightly from parallel light.

The mirror 14 reflects the laser light that has passed through the collimator lenses 12 and 13, toward the scanner 15. The scanner 15 is composed of, for example, a MEMS (micro electro mechanical systems) mirror. The laser light reflected by the mirror 14 is reflected by a movable mirror 15a of the scanner 15 in a direction toward the adjusting lens 16. The scanner 15 drives the movable mirror 15a by a drive signal from a mirror drive circuit 23, and performs scanning with the laser light reflected from the mirror 14, in a direction (X-axis direction) parallel to the generatrix of a lens surface 17a of the magnifying lens 17.

The adjusting lens 16 adjusts the light intensity in the long side direction (Y-axis direction) of the line beam B10. Specifically, the adjusting lens 16 is configured to substantially uniformize the light intensity in the long side direction (Y-axis direction) of the line beam B10. The light intensity in the long side direction (Y-axis direction) of the line beam B10 is uniformized, for example, such that the fluctuation range of the light intensity distribution is within about ±5%.

The magnifying lens 17 spreads the laser light incident from the adjusting lens 16, only in the Y-axis direction. The magnifying lens 17 has a lens surface 17a curved only in the Y-axis direction. In the present embodiment, a concave lens having a lens surface 17a recessed inward is used as the magnifying lens 17. Instead of this, a convex lens (cylindrical lens) having a lens surface projecting outward may be used as the magnifying lens 17. In this case, the laser light converges in the Y-axis direction to form a focal line, and then spreads in the Y-axis direction. The magnifying lens 17 is disposed such that the generatrix of the lens surface 17a is parallel to the X-axis direction. Accordingly, the laser light is spread in the Y-axis direction, and the line beam B10 elongated in the Y-axis direction is formed.

Figure 3A:
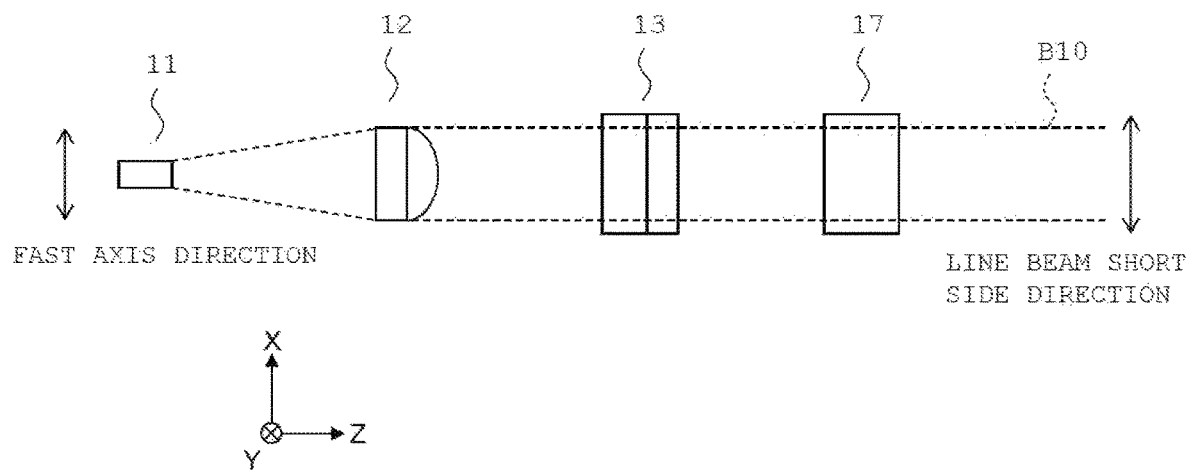
FIG. 3A and FIG. 3B are diagrams in which the action of the optical system of the laser radar according to the embodiment is observed in the long side direction and the short side direction of a line beam, respectively.
Figure 3B:
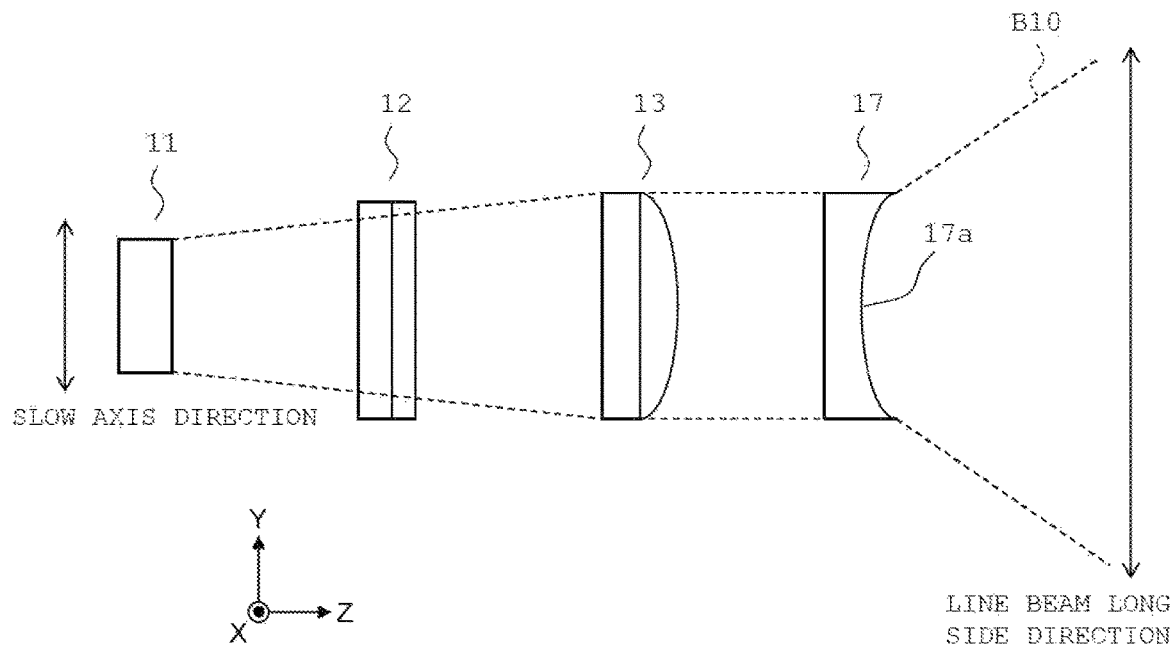

FIG. 3A and FIG. 3B are diagrams in which the action of the optical system of the laser radar 10 is observed in the long side direction and the short side direction of the line beam B10, respectively. For convenience, in FIG. 3A and FIG. 3B, the mirror 14, the scanner 15, and the adjusting lens 16 are omitted, and an optical path from the light source 11 to the magnifying lens 17 is shown so as to be extended linearly.

The laser light emitted from the light source 11 is converged in the fast axis direction and converted into parallel light in the fast axis direction by the first collimator lens 12. At this time, the laser light does not undergo a convergence action in the slow axis direction. Therefore, the laser light after passing through the collimator lens 12 spreads in the slow axis direction at the same spread angle as that immediately after being emitted from the light source 11.

The collimator lens 12 may further have a convergence function in the slow axis direction. In the case where the collimator lens 12 does not have a convergence function in the slow axis direction, the need to increase the size of the lens or the mirror at the stage subsequent to the collimator lens 12 may arise depending on the spread angle or the width in the slow axis direction of the light source 11 and the distance from the collimator lens 12 to the light source 11. Therefore, due to the configuration of the laser radar 10, if it is necessary to reduce the size of the lens or mirror at the stage subsequent to the collimator lens 12, the collimator lens 12 may further have a convergence function in the slow axis direction.

Thereafter, the laser light is converged in the slow axis direction and converted into parallel light in the slow axis direction by the second collimator lens 13. At this time, the laser light does not undergo a convergence action in the fast axis direction. Therefore, the laser light after passing through the collimator lens 13 is maintained as substantially parallel light in the fast axis direction. Accordingly, the laser light converted into parallel light in the fast axis direction and the slow axis direction is incident on the magnifying lens 17.

The second collimator lens 13 may have an optical function of converting the laser light from parallel light to slightly converged light in the slow axis direction. It is sufficient that the laser light to be incident on the magnifying lens 17 has been converted into parallel light in the fast axis direction and converted into parallel light or converged light in the slow axis direction. In addition, the collimator lens 13 may be disposed at the stage previous to the collimator lens 12.

The magnifying lens 17 diffuses the incident laser light only in the slow axis direction to form the line beam B10. Therefore, the line beam B10 travels to a target area while keeping a state where the line beam B10 is converted into parallel light in the fast axis direction by the collimator lens 12. The width in the short side direction of the line beam B10 is determined by the first collimator lens 12. Accordingly, the line beam B10 is projected to the target area.

Figure 4:
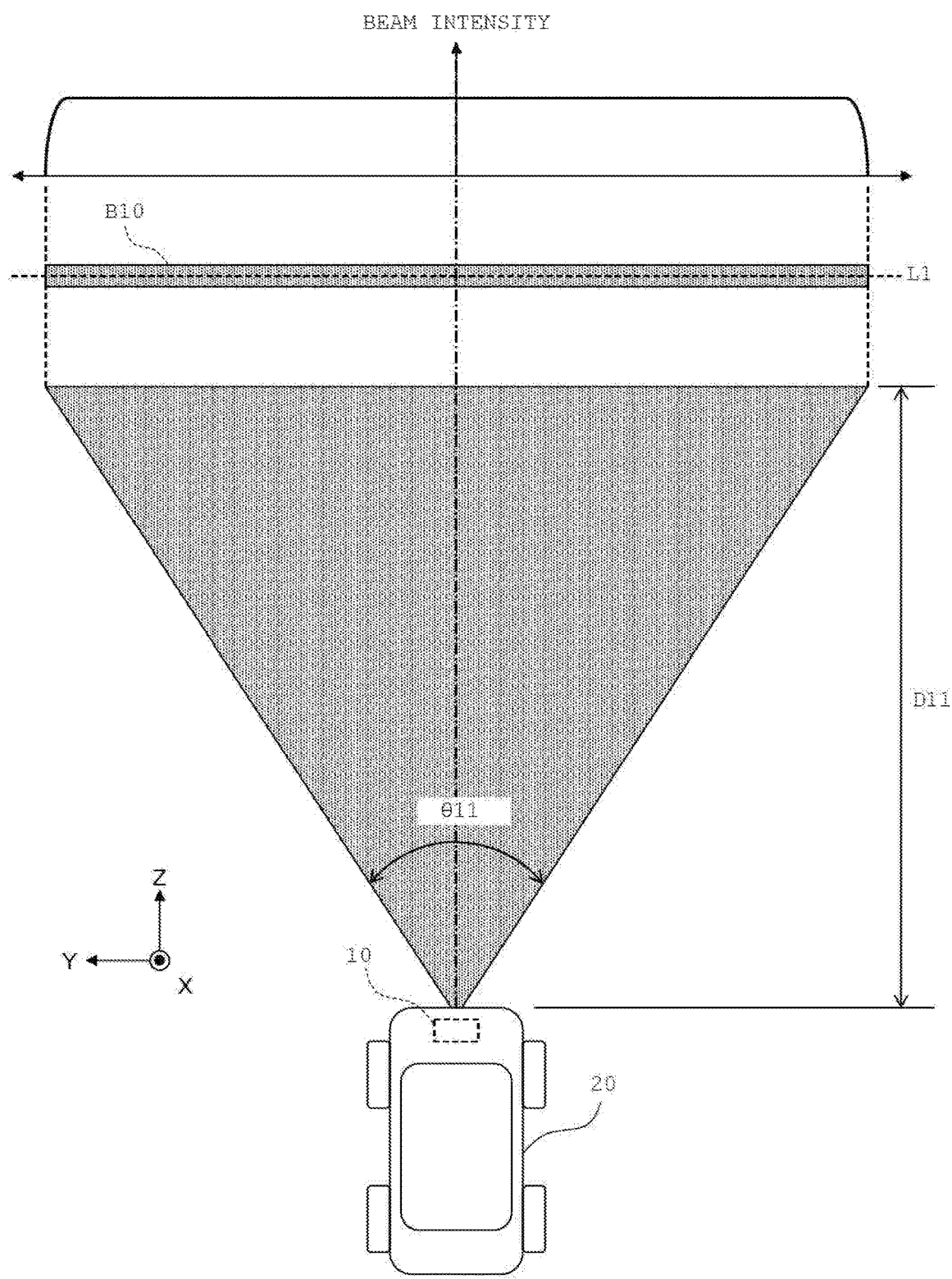
FIG. 4 is a diagram schematically showing an emission state of laser light of the laser radar and an intensity distribution in the long side direction of the line beam in a target area, according to the embodiment.

FIG. 4 is a diagram schematically showing an emission state of the laser light of the laser radar 10 and an intensity distribution in the long side direction of the line beam B10 in the target area. The upper part of FIG. 4 schematically shows a cross-sectional shape of the line beam B10 as viewed in the projection direction (Z-axis positive direction), and a distribution of the light intensity in the long side direction (Y-axis direction) of the line beam B10. Here, the distribution of the light intensity is acquired along the intermediate position in the short side direction of the line beam B10 (a line L1 in FIG. 4).

As shown in FIG. 4, in the present embodiment, the laser radar 10 is mounted on the front side of a vehicle 20, and the line beam B10 is projected forward of the vehicle 20. A spread angle $\theta 11$ in the long side direction of the line beam B10 is, for example, 120°. In addition, the upper limit of a distance D11 within which object detection is possible is, for example, about 200 m. For convenience, in FIG. 4, the spread angle $\theta 11$ is represented so as to be smaller than it actually is. The same applies to FIG. 7 and FIG. 10 which will be referred to later.

In the present embodiment, the adjusting lens 16 is configured such that, when the plurality of laser diodes 110 installed in the light source 11 are driven with the same emission power, the intensity distribution of the line beam B10 in the long side direction is substantially uniform. Since the intensity distribution of the line beam B10 is uniformized as described above, the object detectable distances at positions in the long side direction of the line beam B10 can be equal to each other. The object detectable distance is increased as the intensity of the laser light rises. Therefore, when the intensity distribution of the line beam B10 is uniformized in the long side direction as described above, the object detectable distances at all the positions in the long side direction are substantially equal.

Referring back to FIG. 1, the reflected light, of the line beam B10, reflected from the target area is condensed on a light receiving surface of the light receiving element 19 by the condensing lens 18. The light receiving element 19 is, for example, an image sensor. The light receiving element 19 has, for example, a rectangular light receiving surface, and is disposed such that the long sides of the light receiving surface are parallel to the Y axis. The long side direction of the light receiving surface of the light receiving element 19 corresponds to the long side direction of the line beam B10 in the target area. The reflected light of the line beam B10 is imaged on the light receiving surface of the light receiving element 19 by the condensing lens 18 so as to extend along the long side direction of the light receiving surface.

Here, a pixel position in the Y-axis direction of the light receiving surface corresponds to a position in the Y-axis direction in the target area. Therefore, the position of an object in the Y-axis direction in the target area can be detected on the basis of the positions of pixels at each of which a light reception signal is generated. A line sensor in which pixels are aligned in the Y-axis direction may be used as the light receiving element 19.

The laser radar 10 includes a controller 21, a laser drive circuit 22, the mirror drive circuit 23, and a signal processing circuit 24 as components of the circuitry.

The controller 21 includes an arithmetic processing circuit such as a CPU (central processing unit) and a storage medium such as a ROM (read only memory) and a RAM (random access memory), and controls each part according to a preset program. The laser drive circuit 22 drives each laser diode 110 of the light source 11 in accordance with the control from the controller 21. A control unit that controls the light source 11 is configured by the controller 21 and the laser drive circuit 22.

The mirror drive circuit 23 drives the scanner 15 in accordance with the control from the controller 21. As described above, the controller 21 controls the scanner 15 such that scanning is performed with the laser light in the direction parallel to the generatrix of the lens surface 17a of the magnifying lens 17. Accordingly, in the target area, scanning is performed with the line beam B10 in the short side direction of the line beam B10.

The signal processing circuit 24 outputs a light reception signal at each pixel of the light receiving element 19 to the controller 21. As described above, the controller 21 can detect the position of an object in the Y-axis direction in the target area on the basis of the positions of pixels at each of which a light reception signal is generated. In addition, the controller 21 calculates the distance to the object existing in the target area, on the basis of the time difference between a timing when the light source 11 is caused to emit light in a pulsed manner and a timing when the light receiving element 19 receives reflected light from the target area, that is, a timing when the light reception signal is received from the light receiving element 19.

As described above, the controller 21 detects the presence/absence of an object in the target area by causing the scanner 15 to perform scanning with the line beam B10 while causing the light source 11 to emit light in a pulsed manner, and further measures the position in the Y-axis direction of the object and the distance to the object. These measurement results are transmitted to a control unit on the vehicle side as needed.

<Verification>

Meanwhile, as described above, the laser light emitted from the laser diode 110 does not become perfect parallel light in the fast axis direction even after passing through the collimator lens 12, and travels on the subsequent optical path in a state where the laser light slightly spreads in the fast axis direction. Therefore, the line beam B10 generated by passing through the magnifying lens 17 also slightly spreads in the short side direction. As described above, this phenomenon is caused by the fact that the light emitting portion 117 of each laser diode 110 has a width in the fast axis direction (X-axis direction) and is not a perfect point light source. When the line beam B10 spreads in the short side direction, the light density of the line beam B10 decreases as the detection distance increases, so that the accuracy of object detection decreases.

Therefore, the inventors have verified a preferable range of the divergence angle of the line beam B10 in the short side direction and a preferable range of the width of the light emitting portion 117 in the fast axis direction.

Figure 5A:
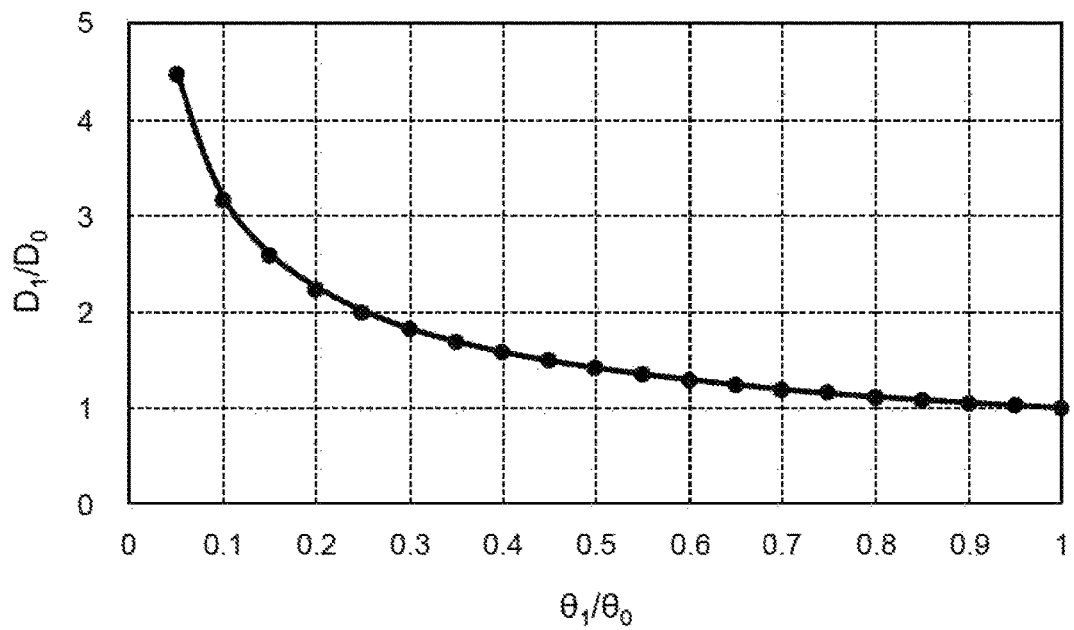
FIG. 5A shows verification results of verifying a preferable range of the divergence angle of the line beam in the short side direction according to Embodiment 1 by optical simulation.

FIG. 5A shows the verification results of verifying a preferable range of the divergence angle of the line beam B10 in the short side direction by optical simulation.

In FIG. 5A, the horizontal axis represents a ratio $\theta1/\theta0$ of divergence angles in the fast axis direction before and after passing through the optical system for generating the line beam B10. $\theta1$ is a divergence angle in the fast axis direction (X-axis direction) of laser light after passing through the optical system from the collimator lens 12 to the magnifying lens 17 shown in FIG. 1, and $\theta0$ is a divergence angle in the fast axis direction (X-axis direction) of the laser light before passing through the optical system (in other words, in the case where the optical system is omitted).

In FIG. 5A, the vertical axis represents a ratio D1/D0 of an object detectable distance D1 in the case where the optical system for generating the line beam B10 is disposed to an object detectable distance D0 in the case where the optical system is omitted. In the verification, the detectable distance means a distance within which laser light can be applied with predetermined intensity.

As shown in FIG. 5A, as the value of the ratio $\theta1/\theta0$ becomes smaller, the value of the ratio D1/D0 sharply increases, and the detectable distance significantly improves. In particular, in the range where the ratio $\theta1/\theta0$ is 0.1 or less, the ratio D1/D0 changes sharply as the ratio $\theta1/\theta0$ decreases. From this, it is found that the detectable distance can be significantly improved when the ratio $\theta1/\theta0$ is 0.1 or less. Therefore, it can be said that it is preferable to set the ratio $\theta1/\theta0$ to 0.1 or less. That is, it can be said that it is preferable to adjust the spread angle in the short side direction of the line beam B10 such that the ratio $\theta1/\theta0$ is 0.1 or less.

Figure 5B:
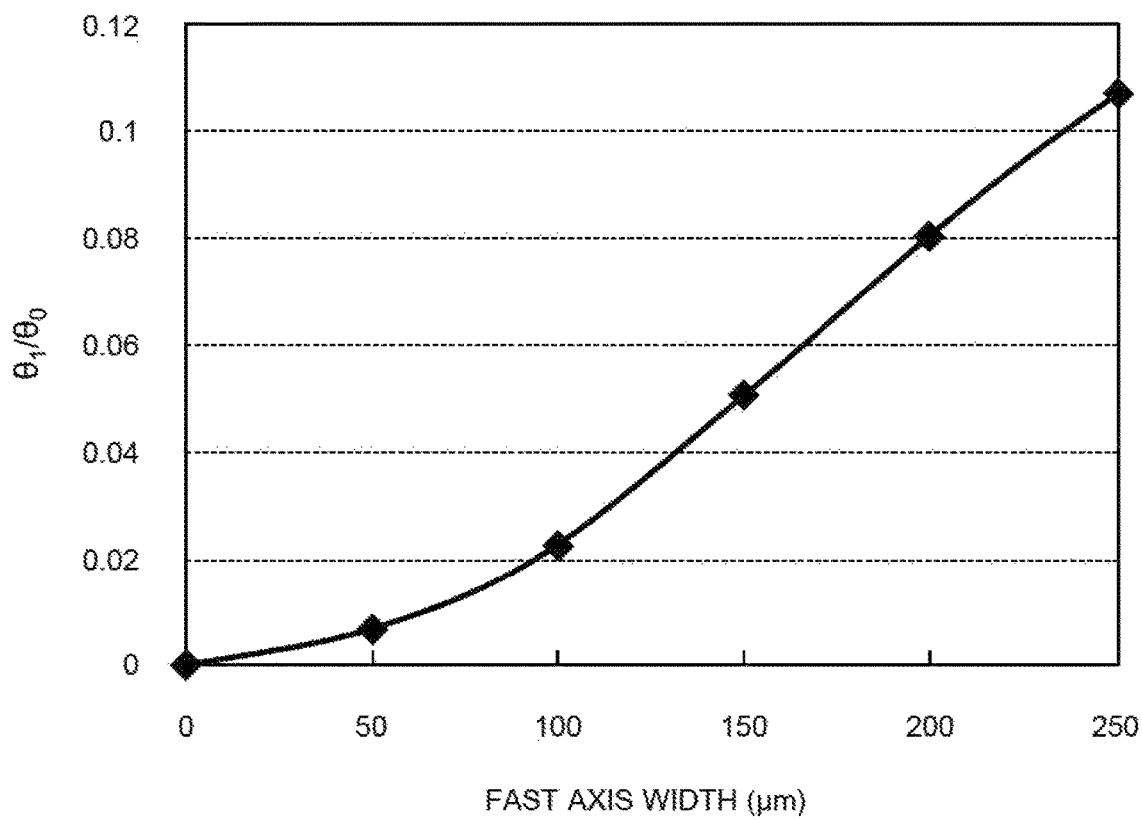
FIG. 5B shows verification results of verifying a preferable range of the width in a fast axis direction of a light emitting portion of the laser diode according to Embodiment 1 by optical simulation.

FIG. 5B shows the verification results of verifying a preferable range of the width of the light emitting portion 117 in the fast axis direction by optical simulation.

In FIG. 5B, the horizontal axis represents the width in the fast axis direction (corresponding to the width W2 in FIG. 2A) of the light emitting portion 117 of the laser diode 110, and the vertical axis represents the same ratio $\theta1/\theta0$ as indicated by the horizontal axis of FIG. 5A.

From the verification results in FIG. 5A, it has been found that it is preferable to set the ratio $\theta1/\theta0$ to 0.1 or less in forming a line beam in order to extend the detectable distance. On the other hand, in the verification results in FIG. 5B, it is found that the width of the light emitting portion 117 in the fast axis direction with which the ratio $\theta1/\theta0$ is 0.1 or less is 240 μm or less. From this, it can be said that it is preferable to set the width in the fast axis direction of the light emitting portion 117 to 240 μm or less.

In other words, in the laser diode 110 that can be used in the range where the value of the ratio $\theta1/\theta0$ is 0.1 or less, the maximum width of the light emitting portion 117 in the fast axis direction is up to 240 μm. In the case where the laser diode 110 in which the maximum width of the light emitting portion 117 in the fast axis direction is greater than 240 μm is used, the light source is increased in size due to the expansion of the light emitting portion 117, and thus the quantity of light from the laser diode 110 itself is increased. However, the increased light quantity is due to the value of the ratio $\theta1/\theta0$ being 0.1 or greater, and thus does not contribute much to improvement of the value of the ratio D1/D0. Therefore, in this case, the design is wasteful.

From the above verification, it can be said that it is preferable to configure the optical system such that the value of the ratio θ1/θ0 is 0.1 or less. Also, for this reason, it is found that the characteristics of the laser diode 110 can be effectively used without waste by setting the width of the light emitting portion 117 of the laser diode 110 in the fast axis direction to 240 μm.

The simulation of FIG. 5A and FIG. 5B is performed with the collimator lenses 12 and 13 replaced by one collimator lens having the functions of both the collimator lenses 12 and 13 in the optical system shown in FIG. 3A and FIG. 3B. Here, the focal distance of the collimator lens is selected such that the beam diameter after passing through this collimator lens is 2 mm. However, the focal distance and the beam diameter are not physical quantities that affect the verification results in FIGS. 5A and 5B. In the above simulation, the wavelength of the laser light is set to 905 nm.

<Light Intensity Control 1>

Meanwhile, when the vehicle 20 travels straight, it can be assumed that the distance within which object detection is required is different between the central range in front of the vehicle and the lateral range in front of the vehicle. That is, in the central range in front of the vehicle, it is preferable to be able to detect an object as far as possible in order to detect a preceding vehicle or an oncoming vehicle. On the other hand, in the lateral range in front of the vehicle, it is only necessary to be able to detect a pedestrian or vehicle suddenly rushing out of a sidewalk, an alley, or the like, and thus it is sufficient if it is possible to detect an object within a relatively close distance range.

Therefore, in the present embodiment, a configuration for causing the light intensity of the line beam B10 to be different in the long side direction of the line beam B10 is provided. Specifically, the light intensity in the long side direction of the line beam B10 is adjusted by the controller 21 causing the emission power of the plurality of laser diodes 110, which form the light source 11, to be different.

Figure 6A:
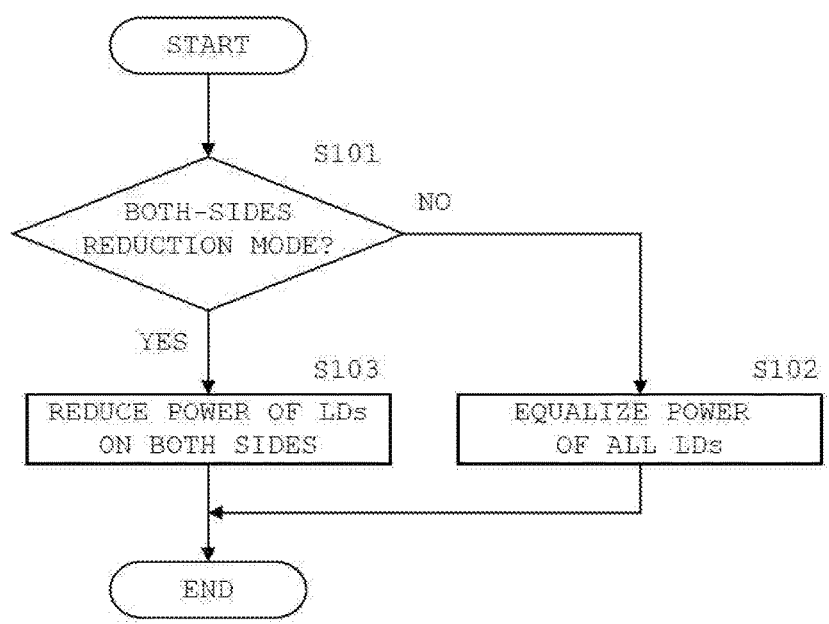
FIG. 6A is a flowchart showing power control of the light source according to the embodiment.

FIG. 6A is a flowchart showing power control of the light source 11 by the controller 21.

The controller 21 has a mode in which the light intensity of the line beam B10 is set to be uniform in the long side direction (uniform mode), and a mode in which the light intensity on both sides in the long side direction of the line beam B10 is reduced to be lower than that at the center (both-sides reduction mode). The mode switching may be set by a user, or may be set according to a command from the control unit on the vehicle side. For example, when the vehicle 20 is in a straight traveling state, the control unit on the vehicle side may command the controller 21 to switch the mode to the both-sides reduction mode. Alternatively, when the controller 21 receives information indicating that the vehicle 20 is in a straight traveling state from the control unit on the vehicle side, the controller 21 may switch the mode.

When the laser radar 10 is started, the controller 21 determines which of the uniform mode or the both-sides reduction mode to set as the mode for the light intensity of the line beam B10, at a predetermined timing (S101). If the controller 21 determines the uniform mode (S101: NO), the controller 21 drives all the laser diodes 110 forming the light source 11, with uniform emission power (S102). Accordingly, the line beam B10 is projected to the target area with uniform light intensity shown in FIG. 4.

On the other hand, if the controller 21 determines the both-sides reduction mode (S101: YES), the controller 21 reduces the emission power of a predetermined number of laser diodes 110 disposed on both sides in the slow axis direction, among the laser diodes 110 forming the light source 11, to be lower than the emission power of the remaining laser diodes 110 (S103).

Figure 6B:
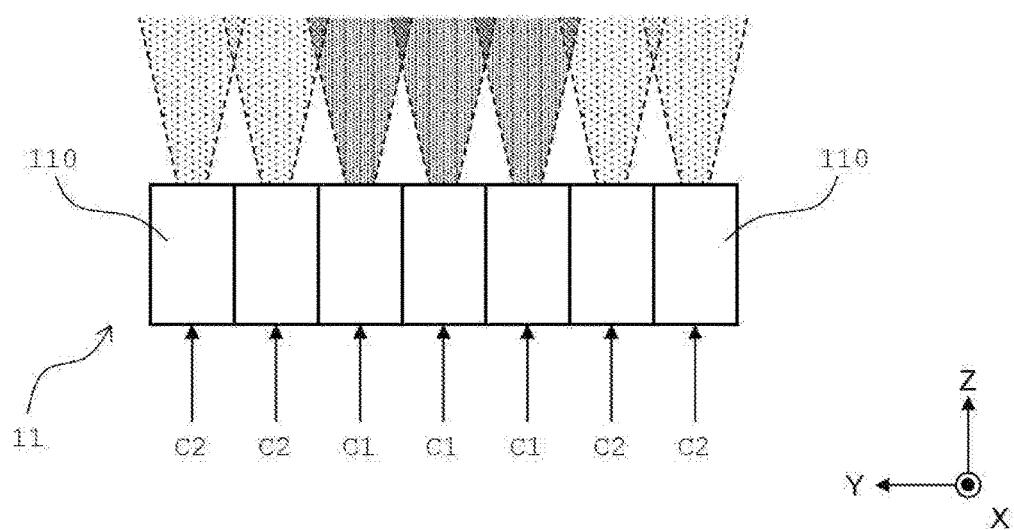
FIG. 6B is a diagram schematically showing an emission state of each laser diode in the case where setting of reducing the emission power of laser diodes on both sides is performed in the control in FIG. 6A.

FIG. 6B is a diagram schematically showing an emission state of each laser diode 110 in the case where the both-sides reduction mode is set in the control in FIG. 6A. For convenience, the light source 11 is composed of seven laser diodes 110. However, the number of laser diodes 110 forming the light source 11 is not limited thereto.

In the case where the both-sides reduction mode is set, a drive current C2 to be applied to two laser diodes 110 at the end on the Y-axis positive side and two laser diodes 110 at the end on the Y-axis negative side is reduced to be lower than a drive current C1 to be applied to three laser diodes 110 at the center. Accordingly, the emission power of the laser diodes 110 at the ends to which the drive current C2 is applied becomes lower than the emission power of the laser diodes 110 at the center to which the drive current C1 is applied. Here, the reduction in the emission power of the laser diodes 110 at the ends with respect to that of the laser diodes 110 at the center is set to, for example, about 25%.

The number of laser diodes 110 for which the emission power is reduced is not limited to four. The number of laser diodes 110 for which the emission power is reduced can be changed as appropriate in accordance with the ratio of the range in which the light intensity of the line beam B10 is reduced, the number of laser diodes 110 forming the light source 11, etc.

Figure 7:
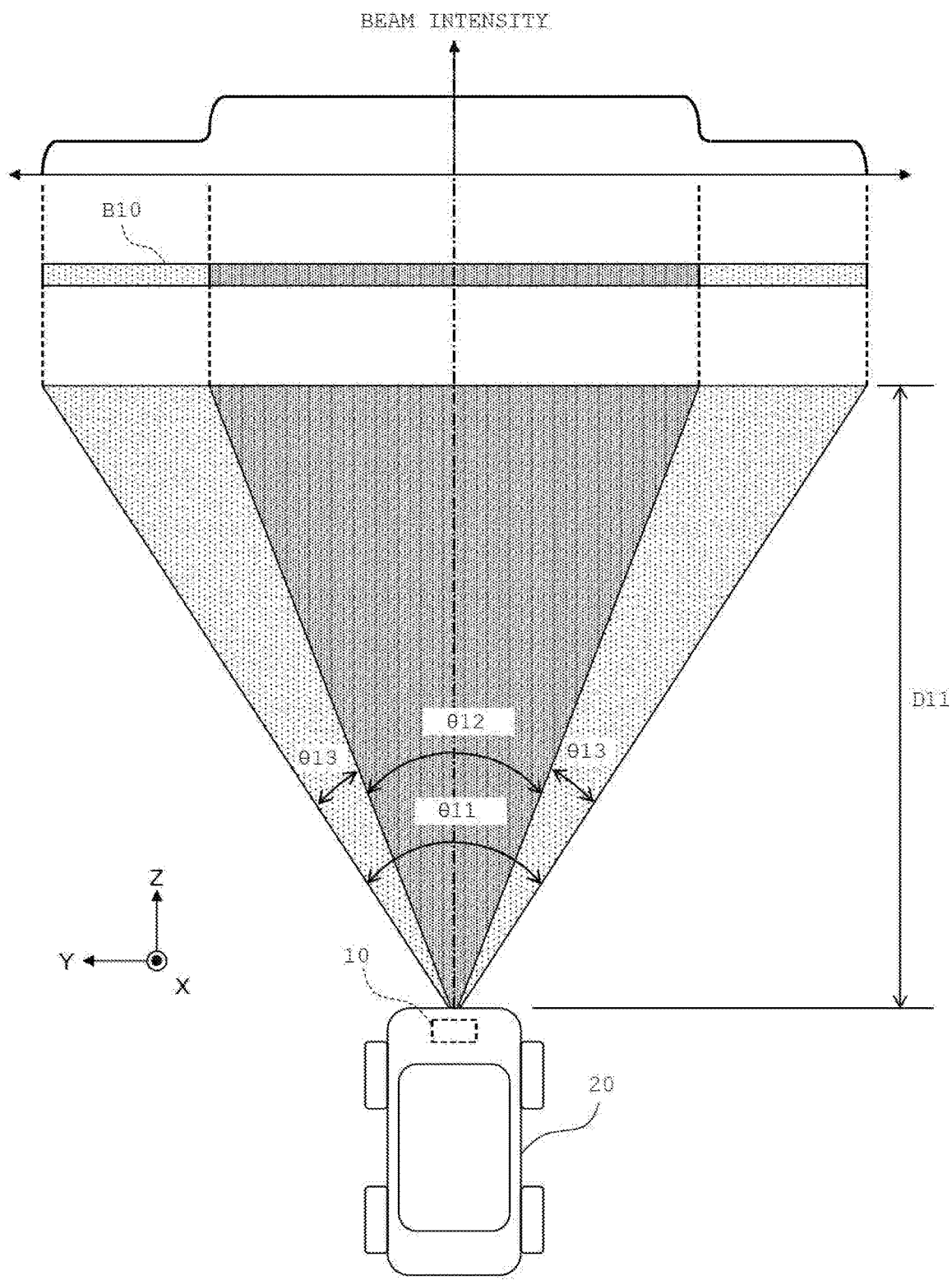
FIG. 7 is a diagram schematically showing a state of laser light emitted from the laser radar and an intensity distribution in the long side direction of a line beam in a target area in the case where the setting of reducing the emission power of the laser diodes on both sides is performed in the control in FIG. 6A.

FIG. 7 is a diagram schematically showing a state of the laser light emitted from the laser radar 10 and an intensity distribution in the long side direction of the line beam B10 in the target area in the case where the both-sides reduction mode is set in the control in FIG. 6A.

In the spread angle θ11 in the long side direction of the line beam B10 (for example, 120°), the light intensity is maintained high in an angle range θ12 at the center, and the light intensity is reduced in an angle range θ13 on each side to be lower than that at the center. Here, the angle range θ12 is, for example, about 60°, and the angle range θ13 is, for example, about 30°. However, the angle ranges θ12 and θ13 are not limited thereto.

Moreover, in the case where the object detectable distance in the angle range θ12 at the center is set to about 200 m, and the object detectable distance in the angle range θ13 at each end is set to about 100 m, a reduction in the light intensity in the angle range θ13 with respect to the light intensity in the angle range θ12 is adjusted to, for example, about 25%. The reduction in the light intensity in the angle range θ13 with respect to the light intensity in the angle range θ12 is not limited to 25%.

By causing the light intensity of the line beam B10 to be different as described above, for example, the object detectable distance is maintained as long as about 200 m in the angle range θ12 at the center, and the object detectable distance is shorter in the angle range θ13 at each end than that at the center. However, when the vehicle travels straight, if the detectable distance in the angle range θ13 on each side is reduced as described above, there is almost no obstacle in detecting a pedestrian or vehicle suddenly rushing out of a sidewalk, an alley, or the like. In addition, by reducing the light intensity at each end as described above, the power consumption of the entire light source 11 can be reduced. Thus, it is possible to more efficiently perform object detection while reducing the power consumption.

Here, the light intensity of the line beam B10 is caused to be different by adjusting the drive current to each laser diode 110 forming the light source 11. However, the light intensity of the line beam B10 may be caused to be different in the long side direction by another method.

Figure 8A:
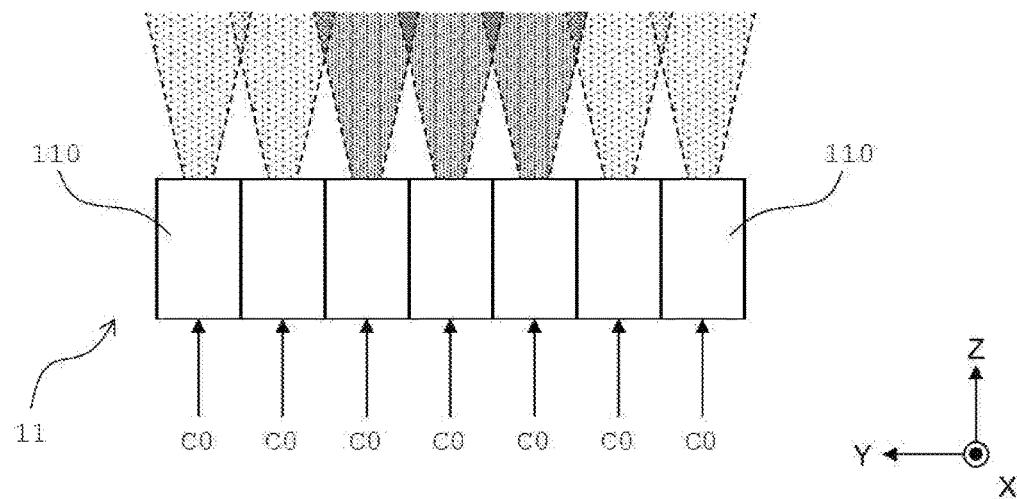
FIG. 8A is a diagram showing another configuration example for reducing the emission power of the laser diodes on both sides according to the embodiment.

For example, a plurality of laser diodes 110 having different emission abilities may be disposed in the light source 11 as shown in FIG. 8A. That is, a plurality of laser diodes 110 that emit laser light with different emission power even when the same drive current C0 is applied thereto may be disposed in the light source 11.

In the example of FIG. 8A, among seven laser diodes 110, the emission abilities of the two laser diodes 110 at the end on the Y-axis positive side and the two laser diodes 110 at the end on the Y-axis negative side are lower than those of the three laser diodes 110 at the center. The controller 21 applies the same drive current C0 to all the laser diodes 110. Accordingly, the emission power of the two laser diodes 110 at each end is lower than the emission power of the three laser diodes 110 at the center.

Figure 8B:
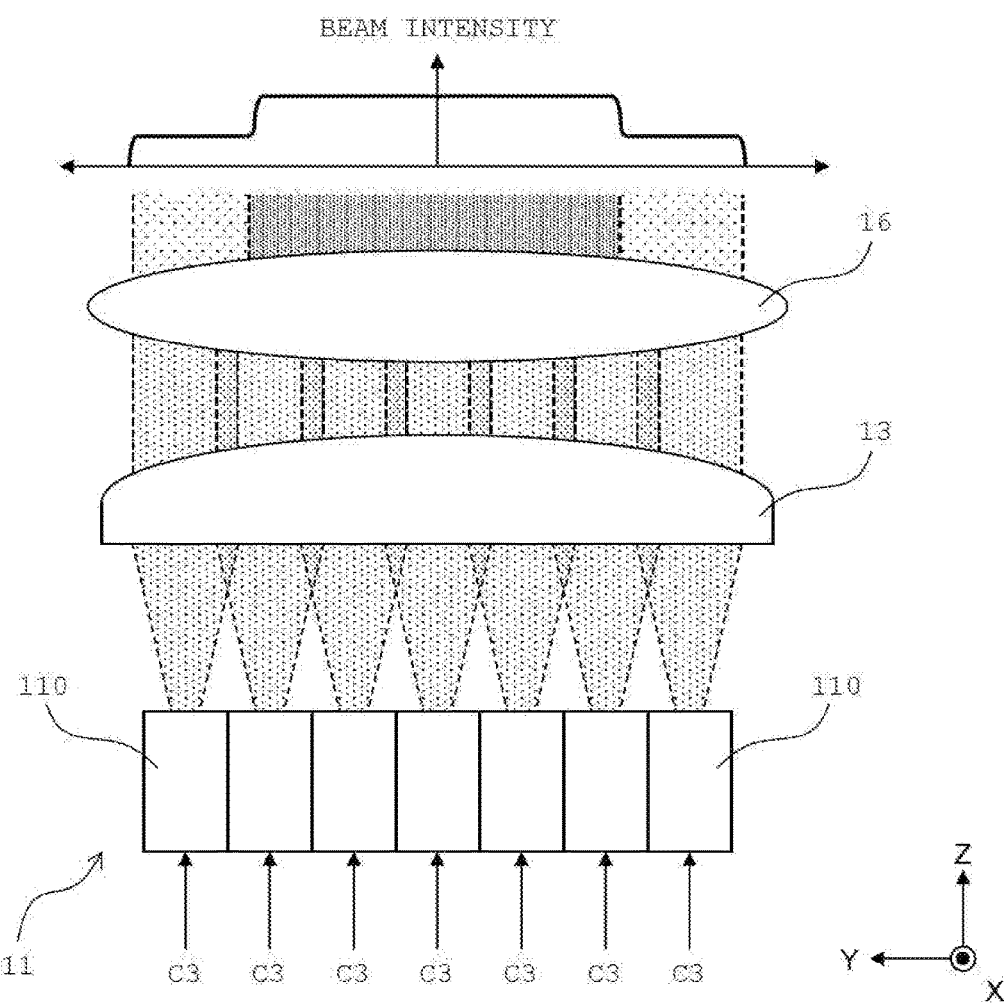
FIG. 8B is a diagram showing still another configuration example for reducing the emission power of the laser diodes on both sides according to the embodiment.

Alternatively, as shown in FIG. 8B, the adjusting lens 16 may be configured such that the light intensity at each end in the slow axis direction is lower than the light intensity at the center. For convenience, in FIG. 8B, the collimator lens 12, the mirror 14, and the scanner 15 are not shown.

In this configuration, all the laser diodes 110 forming the light source 11 have the same emission ability. The controller 21 applies the same drive current C3 to all the laser diodes 110 to cause each laser diode 110 to emit laser light with equal power. The laser light emitted from the respective laser diodes 110 is converted by the adjusting lens 16 into a beam having high light intensity at the center and low light intensity at each end in the slow axis direction. Thereafter, the beam is spread in the slow axis direction by the magnifying lens 17. Accordingly, the line beam B10 is generated.

Also, even with these configurations, similar to FIG. 7, the line beam B10 having high light intensity at the center and low light intensity at each end in the long side direction is obtained. In these cases as well, a reduction in the light intensity in the angle range θ13 at each end with respect to the light intensity in the angle range θ12 at the center is adjusted to, for example, about 25%.

In the configuration examples, the light intensity of the line beam B10 cannot be switched between the uniform mode and the both-sides reduction mode as in the configuration example shown in FIG. 6A and FIG. 6B. However, in these cases as well, since the light intensity at each end is adjusted so as to be reduced to be lower than that at the center, the laser light from which the line beam B10 is generated can be efficiently used. Thus, it is possible to more efficiently perform object detection.

<Light Intensity Control 2>

In the above, the light intensity at each end of the line beam B10 is adjusted so as to be reduced to be lower than that at the center, but the manner for causing the light intensity of the line beam B10 to be different is not limited thereto.

For example, when the vehicle 20 travels in the leftmost lane of a highway, a roadside strip or a wall may continually be present on the left side of the vehicle 20. In such a case, on the left side of the vehicle 20, it is not necessary to detect an object at a long distance. Therefore, when a signal indicating such a state is transmitted from the control unit on the vehicle side to the controller 21, the controller 21 may reduce the light intensity in a range of the line beam B10 corresponding to the left side of the vehicle 20.

Moreover, when the vehicle 20 makes a right turn at an intersection, it is necessary to detect an object at a long distance on the left front side of the vehicle 20 in order to grasp the situation of a straight oncoming vehicle from the front. However, on the right front side of the vehicle 20, it is only necessary to be able to detect a person crossing the intersection or a vehicle stopping on the right-turn-side road, and thus it is sufficient if it is possible to detect an object at a relatively close distance. Therefore, when a signal indicating that the vehicle 20 is making a right turn is transmitted from the control unit on the vehicle side to the controller 21, the controller 21 may reduce the light intensity in a range of the line beam B10 corresponding to the right side of the vehicle 20.

As described above, the light intensity of the line beam B10 may be adjusted such that only the light intensity of the line beam B10 on either one of end sides in the long side direction is reduced to be lower than that in the other portion.

Figure 9A:
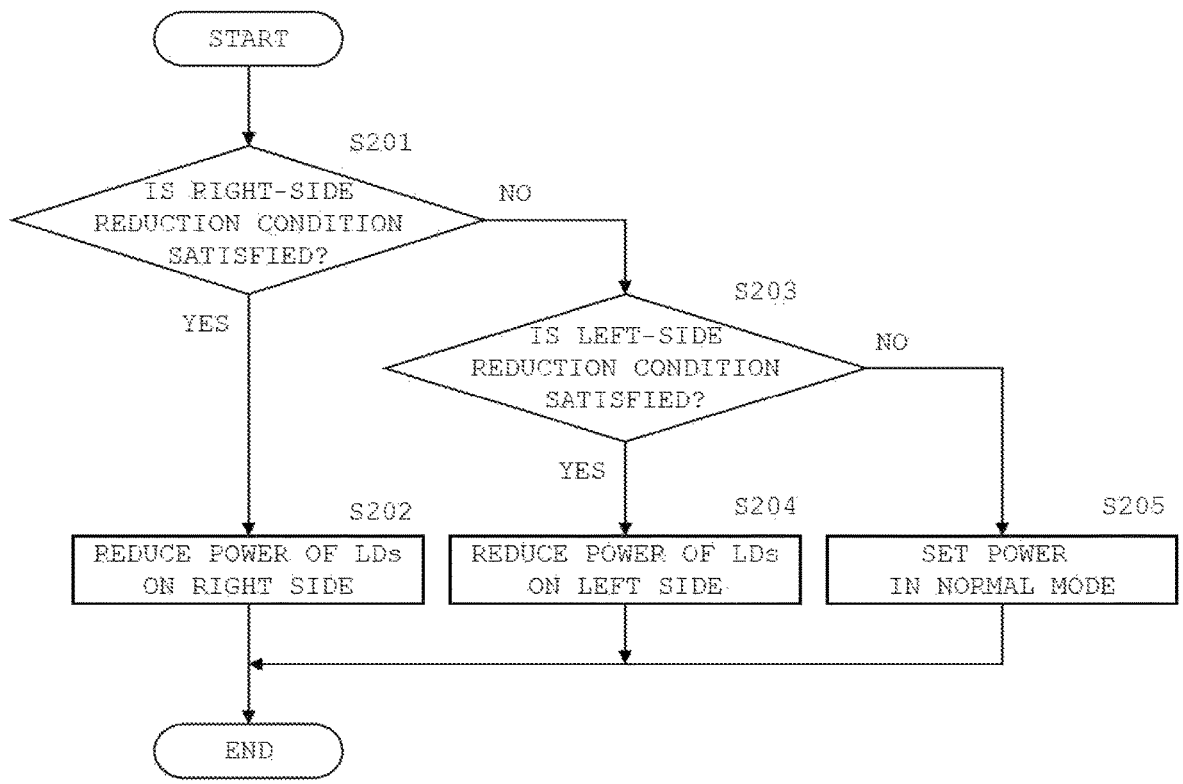
FIG. 9A is a flowchart showing other power control of the light source according to the embodiment.

FIG. 9A is a flowchart showing power control of the light source 11 in this case.

The controller 21 determines whether or not either one of a preset right-side reduction condition (S201) and a preset left-side reduction condition (S203) is satisfied.

Here, the right-side reduction condition is a condition for reducing the light intensity in a predetermined range on the end side (Y-axis negative side) of the line beam B10 corresponding to the front right side of the vehicle 20. The condition that the vehicle 20 is making a right turn is included in the right-side reduction condition. The right-side reduction condition may include conditions other than the condition that the vehicle 20 is making a right turn.

Moreover, the left-side reduction condition is a condition for reducing the light intensity in a predetermined range on the end side (Y-axis positive side) of the line beam B10 corresponding to the front left side of the vehicle 20. The condition that the vehicle 20 is travelling in the leftmost lane of a highway as described above is included in the left-side reduction condition. The left-side reduction condition may include conditions other than the condition that the vehicle 20 is travelling in the leftmost lane of a highway.

If the right-side reduction condition is satisfied (S201: YES), the controller 21 reduces the emission power of the laser diodes 110 corresponding to the vehicle right side (Y-axis negative side), among the plurality of laser diodes 110 forming the light source 11, to be lower than that of the other laser diodes 110 (S202). That is, in this case, the controller 21 reduces the emission power of a predetermined number of laser diodes 110 from the Y-axis negative side, among the plurality of laser diodes 110 aligned in the Y-axis direction, to be lower than that of the other laser diodes 110.

Moreover, if the left-side reduction condition is satisfied (S201: NO, S203: YES), the controller 21 reduces the emission power of the laser diodes 110 corresponding to the vehicle left side (Y-axis positive side), among the plurality of laser diodes 110 forming the light source 11, to be lower than that of the other laser diodes 110 (S204). That is, in this case, the controller 21 reduces the emission power of a predetermined number of laser diodes 110 from the Y-axis positive side, among the plurality of laser diodes 110 aligned in the Y-axis direction, to be lower than that of the other laser diodes 110.

If neither the right-side reduction condition nor the left-side reduction condition is satisfied (S201: NO, S203: NO), the controller 21 controls the light source 11 in a normal mode (S205). That is, the controller 21 causes all of the plurality of laser diodes 110 aligned in the Y-axis direction to equally emit light with emission power for a long distance. In this case, the light intensity of the line beam B10 is the same as the light intensity shown in FIG. 4. The controller 21 repeatedly executes the process in FIG. 9A.

Figure 9B:
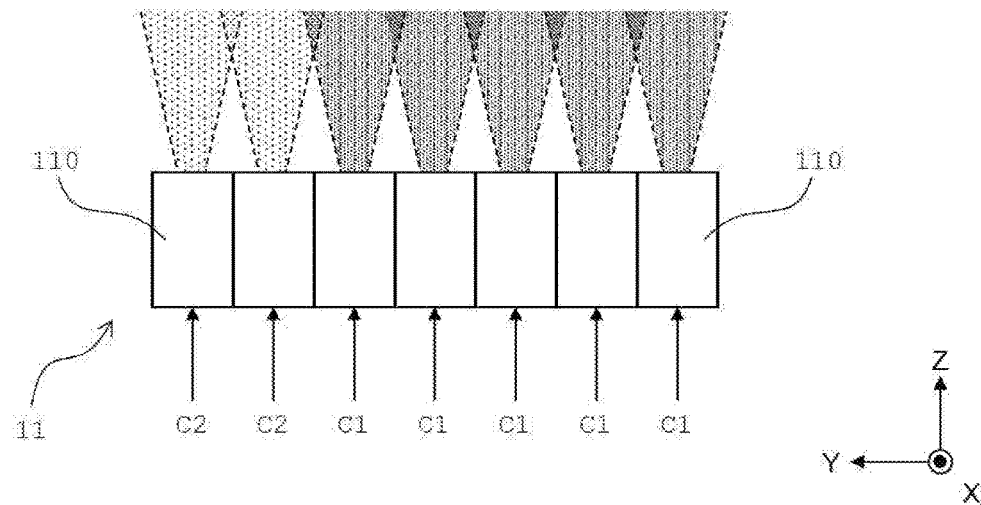
FIG. 9B is a diagram schematically showing emission states of a plurality of laser diodes in the case where the control in FIG. 9A is performed.

FIG. 9B is a diagram schematically showing emission states of the plurality of laser diodes 110 in the case where the emission power of the laser diodes 110 on the left side is reduced by step S204 in FIG. 9A.

Here, for convenience, the light source 11 is composed of seven laser diodes 110. Similar to the case of FIG. 6B, the seven laser diodes 110 have the same emission ability. The controller 21 sets the drive current C2 to be applied to the two laser diodes 110 at the end on the Y-axis positive side to be lower than the drive current C1 to be applied to the other laser diodes 110.

Figure 10:
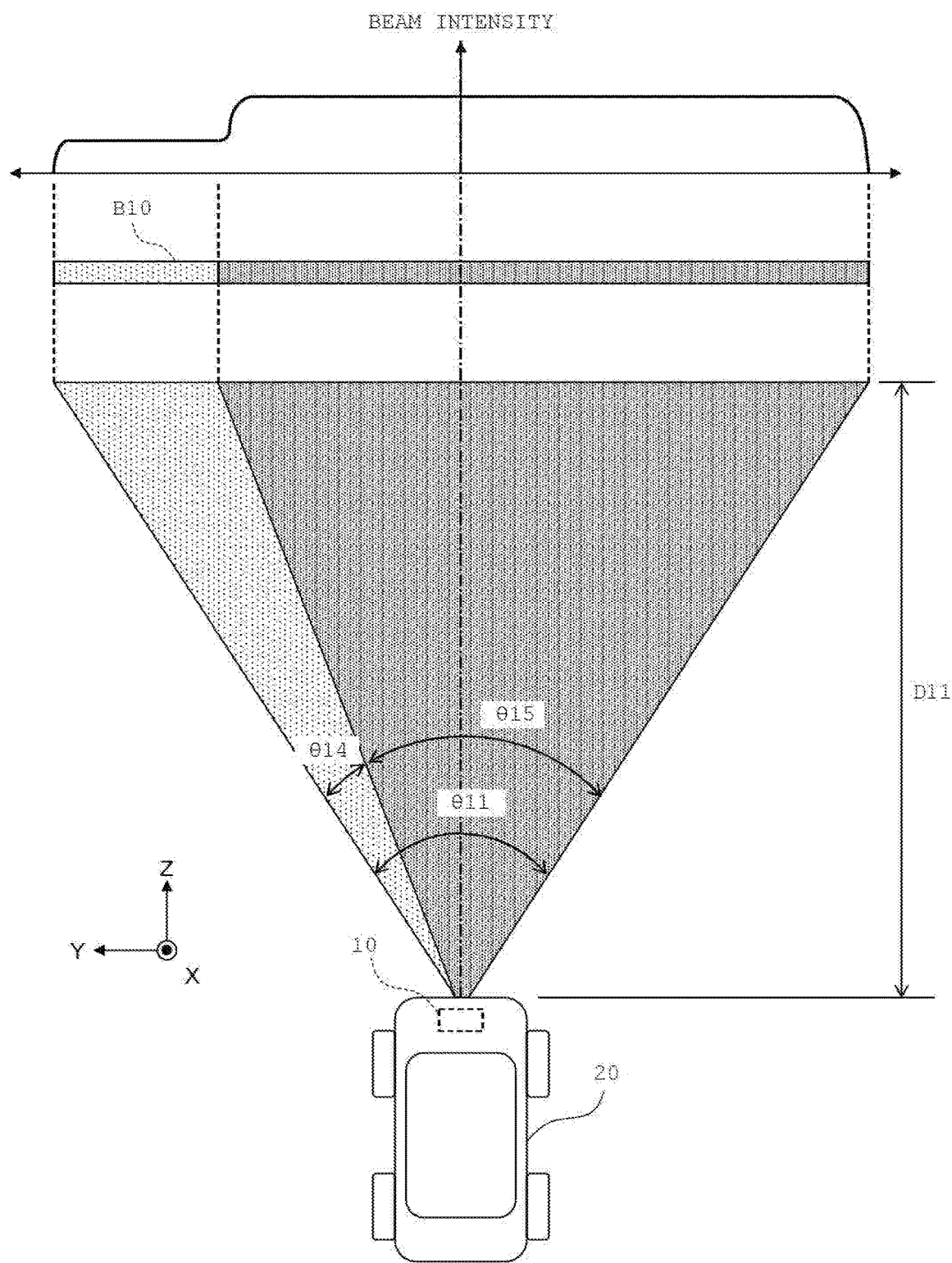
FIG. 10 is a diagram schematically showing a state of laser light emitted from the laser radar and an intensity distribution in the long side direction of a line beam in a target area in the case where setting of reducing the emission power of laser diodes on the left side is performed in the control in FIG. 9A according to the embodiment.

FIG. 10 is a diagram schematically showing a state of the laser light emitted from the laser radar 10 and a distribution of the light intensity in the long side direction of the line beam B10 in the target area in the case where setting of reducing the emission power of the laser diodes 110 on the left side is performed in step S204 in FIG. 9A.

In the spread angle θ11 in the long side direction of the line beam B10 (for example, 120°), the light intensity in an angle range θ14 at the left end is reduced to be lower than that in an angle range 815 in the other portion. Similar to the case of FIG. 4, the light intensity in the angle range θ15 is maintained high. The angle range θ14 is, for example, about 30°, and the angle range θ15 is, for example, about 90°. However, the angle ranges θ14 and θ15 are not limited thereto.

Moreover, in the case where the object detectable distance in the angle range θ15 is set to about 200 m, and the object detectable distance in the angle range θ14 at the left end is set to about 100 m, a reduction in the light intensity in the angle range θ14 with respect to the light intensity in the angle range θ15 is adjusted to, for example, about 25%. The reduction in the light intensity in the angle range θ14 with respect to the light intensity in the angle range θ15 is not limited to 25%.

By causing the light intensity of the line beam B10 to be different as described above, for example, the object detectable distance is maintained as long as about 200 m in the angle range θ15, and the object detectable distance becomes shorter in the angle range θ14 at the left end than that at the center. However, when the vehicle travels in the leftmost lane of a highway, a roadside strip or a wall exists on the left side of the vehicle. Thus, even when the detectable distance in the angle range θ14 on the left side is reduced as described above, there is almost no obstacle in travelling of the vehicle. Thus, by reducing the light intensity at the left end as described above, it is possible to more efficiently perform object detection while reducing the power consumption.

In the case where setting of reducing the emission power of the laser diodes 110 on the right side is performed in step S202 in FIG. 9A, the controller 21 performs, for example, control in which the emission power of the laser diode 110 on the rightmost side and the second laser diode 110 from the right among the seven laser diodes 110 shown in FIG. 9B are reduced to be lower than that of the other laser diodes 110.

Figure 11:
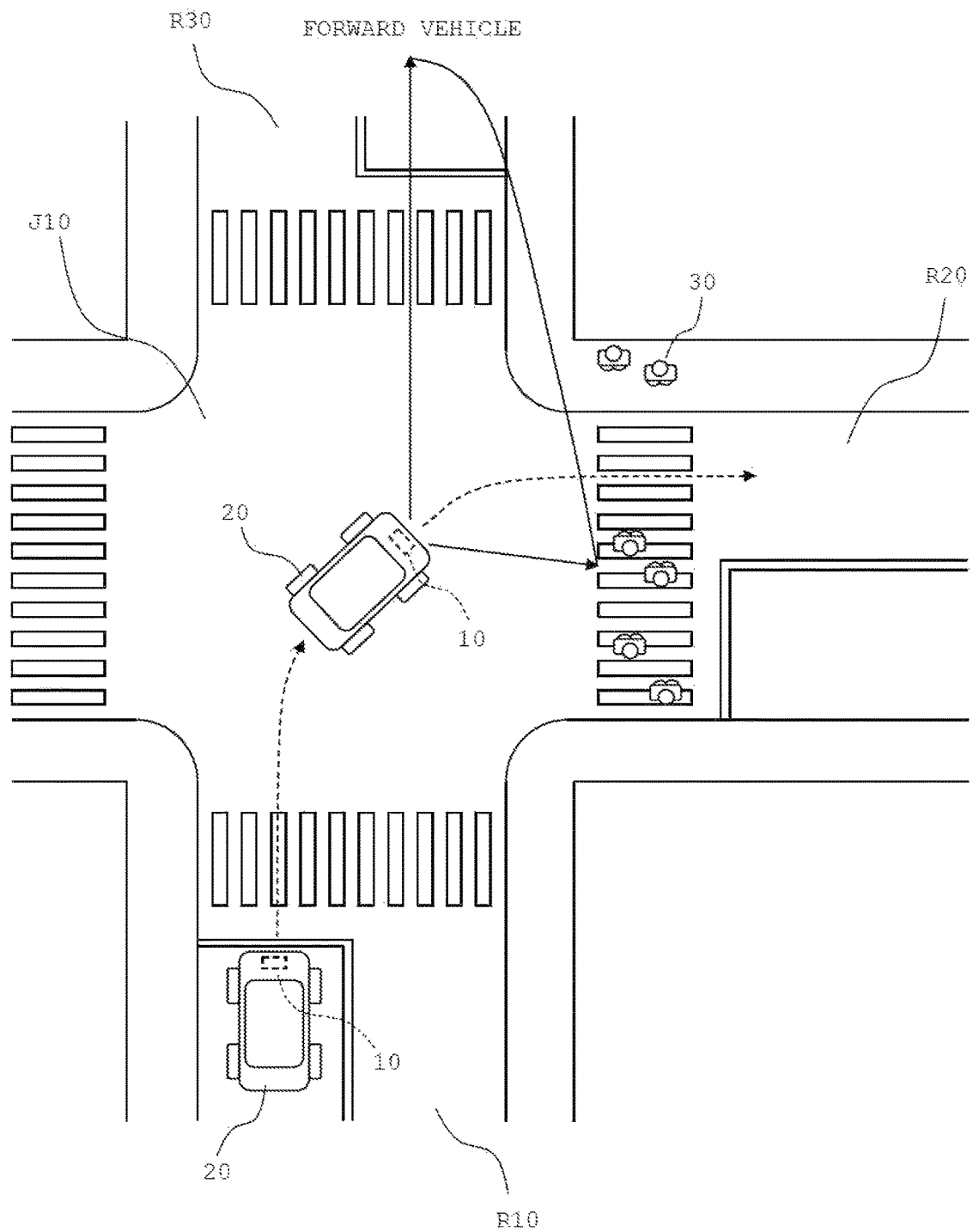
FIG. 11 is a diagram schematically showing a situation in the case where the setting of reducing the emission power of the laser diode on the right side is performed in the control in FIG. 9A.

FIG. 11 is a diagram schematically showing a situation in the case where the setting of reducing the emission power of the laser diodes 110 on the right side is performed in step S202 in FIG. 9A.

Here, an example in which the emission power of the laser diodes 110 on the right side is reduced on condition that the vehicle 20 makes a right turn at an intersection J10, is shown.

When the vehicle 20 makes a right turn at the intersection J10 from the road R10 and travels to a right-turn-side road R20, control in which the light intensity in a predetermined range at the right-side end of the line beam B10 is reduced is performed from the time when the vehicle 20 starts the right turn to the time when the right turn is ended. Accordingly, the object detectable distance is decreased in the predetermined range at the right-side end of the line beam B10. In the other range of the line beam B10, the light intensity is maintained high, and thus the object detectable distance is maintained long similar to the case of FIG. 4.

Here, when the vehicle 20 is making a right turn at the intersection J10, it can be said that, on the left front side of the vehicle 20, it is necessary to detect an object at a long distance in order to grasp the situation of an oncoming vehicle travelling in the opposite direction on a road R30 ahead. On the other hand, on the right front side of the vehicle 20, it is only necessary to be able to detect a person 30 crossing a crosswalk at the intersection J10 or a vehicle stopping on the right-turn-side road R20, and thus it is sufficient if it is possible to detect an object at a relatively close distance. Therefore, when the vehicle 20 is making a right turn, even if the object detectable distance is reduced by reducing the light intensity in the range of the line beam B10 corresponding to the right side of the vehicle 20, there is no obstacle in travelling of the vehicle 20. Accordingly, by reducing the light intensity at the right-side end during a right turn as described above, it is possible to more efficiently perform object detection while reducing the power consumption.

In step S202 in FIG. 9A, the number of laser diodes 110 for which the emission power is reduced, or the amount of the reduction may be changed for each type of the right-side reduction condition that is satisfied in step S201. In addition, when the vehicle 20 makes a right turn, the number of laser diodes 110 for which the emission power is reduced, or the amount of the reduction may be changed according to the rotation angle from the neutral position of the steering wheel.

Similarly, in step S204 in FIG. 9A as well, the number of laser diodes 110 for which the emission power is reduced, or the amount of the reduction may be changed for each type of the left-side reduction condition that is satisfied in step S203. In addition, the number of laser diodes 110 for which the emission power is reduced, or the amount of the reduction may be changed according to the travelling speed of the vehicle 20. That is, for the laser diodes 110 for which the emission power is reduced, the emission power may be different for each laser diode 110 depending on a predetermined condition such as a traveling state.

Effects of Embodiment

According to the present embodiment described above, the following effects are achieved.

As described with reference to FIG. 2A to FIG. 2C, each laser diodes 110 is disposed such that the fast axis 118a, on which optical control is more easily performed, extends along a direction corresponding to the short side direction of the line beam B10 (X-axis direction). Thus, the beam spread angle in the short side direction of the line beam B10 can be adjusted such that the line beam B10 is closer to parallel light. Therefore, a decrease in the energy density in the short side direction of the line beam B10 can be effectively inhibited, and an object at a longer distance can be detected.

Moreover, as shown in FIG. 2C, the plurality of laser light emitting portions 117 are disposed along the slow axis direction of the laser diodes 110. Accordingly, the light quantity of the line beam B10 can be effectively increased. In addition, by individually controlling each laser diode 110 as described with reference to FIG. 6A to FIG. 7 and FIG. 9A to FIG. 11, the light intensity of the line beam B10 can be smoothly caused to be different in the long side direction.

In the configuration of FIG. 2C, the plurality of light emitting portions 117 are disposed along the slow axis direction by aligning and integrating the plurality of laser diodes 110 along the slow axis direction. However, one laser diode 110 may be configured such that a plurality of light emitting portions 117 are provided along the slow axis direction in this laser diode 110.

Moreover, as shown in the verification results in FIG. 5A, the optical system for generating the line beam B10 is preferably configured such that, when the divergence angle in the fast axis direction of the laser light before passing through the optical system is denoted by $θ0$, and the divergence angle in the fast axis direction of the laser light after passing through the optical system is denoted by $θ1$, $θ1/θ0$ is 0.1 or less. Accordingly, the object detectable distance can be significantly increased.

Moreover, as shown in the verification results in FIG. 5B, in each laser diode 110, the width of the light emitting portion 117 in the fast axis direction is preferably 240 µm or less. Accordingly, it is possible to efficiently increase the object detectable distance while effectively using the characteristics of the laser diode 110 without waste.

Moreover, in the present embodiment, as shown in FIG. 1, the scanner 15 is disposed at the light source 11 side (laser diode 110 side) with respect to the magnifying lens 17. Accordingly, laser light having a small beam diameter before being spread by the magnifying lens 17 can be guided to the scanner 15, and the scanner 15 that is small in size and has high response can be used. Therefore, it is possible to smoothly and appropriately perform scanning with the line beam B10 while achieving cost reduction.

Moreover, in the present embodiment, as described with reference to FIG. 1, the magnifying lens 17 has a lens surface 17a curved only in one direction, and the scanner 15 performs scanning with the laser light in the direction (X-axis direction) parallel to the generatrix of the lens surface 17a, thereby performing scanning with the line beam B10 in the short side direction. By performing scanning with the laser light in the direction parallel to the generatrix of the lens surface 17a as described above, a large change in the optical action given to the laser light from the magnifying lens 17 with the scanning of the laser light can be inhibited. Therefore, the beam profile of the line beam B10 can be stabilized, and the object detection accuracy can be enhanced.

Moreover, in the present embodiment, as shown in FIG. 1, the scanner 15 is disposed between the collimator lenses 12 and 13 and the magnifying lens 17. Accordingly, laser light converted into parallel light and having a small beam diameter can be guided to the scanner 15, and the scanner 15 that is small in size and has high response can be used. Therefore, it is possible to smoothly and appropriately perform scanning with the line beam B10 while achieving cost reduction.

Moreover, in the present embodiment, as shown in FIG. 1, the optical system for generating the line beam B10 includes the adjusting lens 16 which adjusts the light intensity in the long side direction of the line beam B10. Accordingly, for example, as shown in FIG. 4, the light intensity of the line beam B10 can be substantially uniformized in the long side direction of the line beam B10, and objects can be detected with high accuracy at all the positions in the long side direction. Alternatively, as shown in FIG. 8B, the light intensity of the line beam B10 can also be caused to be different in the long side direction of the line beam B10 by the adjusting lens 16.

Moreover, by causing the light intensity of the line beam B10 to be different in the long side direction of the line beam B10 as shown in FIG. 6A to FIG. 11, the laser light emitted from the light source 11 can be used more efficiently.

For example, by adjusting the light intensity of the line beam B10 such that the light intensity on both end sides in the long side direction is reduced to be lower than that at the center in the long side direction of the line beam B10 as shown in FIG. 6A to FIG. 8B, the laser light can be more efficiently used during straight travelling. That is, in the front of the vehicle where object detection is required at a long distance, a long detectable distance can be ensured by maintaining normal light intensity, and, on the lateral side of the vehicle where object detection at a relatively close distance is sufficient, the detectable distance can be decreased by reducing the light intensity. Accordingly, the laser light emitted from the light source 11 can be used more efficiently.

Moreover, by adjusting the light intensity of the line beam B10 such that the light intensity on one end side in the long side direction of the line beam B10 is reduced to be lower than that at the center in the long side direction as shown in FIG. 9A to FIG. 11, the laser light can be more efficiently used during travelling on a highway, a right turn at an intersection, or the like.

For example, when the vehicle 20 is travelling in the leftmost lane of a highway, since a roadside strip or a wall is continually present on the left side of the vehicle 20, object detection at a long distance is not necessary. Thus, in this case, by reducing the intensity at the left-side end of the line beam B10 to decrease the detectable distance, it is possible to appropriately perform object detection while using the laser light more efficiently.

Alternatively, when the vehicle 20 is making a right turn at an intersection, it is sufficient on the right side of the vehicle 20 if it is possible to detect a person crossing a crosswalk or the state of a stopped vehicle, and thus object detection at a long distance is not necessary on the right side of the vehicle 20. Therefore, in this case, by reducing the intensity at the right-side end of the line beam B10 to decrease the detectable distance, it is possible to appropriately perform object detection while using the laser light more efficiently.

In the case where the light source 11 is configured such that the plurality of light emitting portions 117 are disposed in the direction corresponding to the long side direction of the line beam B10 as shown in FIG. 2C, the light intensity of the line beam B10 is preferably caused to be different in the long side direction of the line beam B10 by the controller 21 controlling the output of each light emitting portion 117 as shown in FIG. 6A and FIG. 9A. Accordingly, the light intensity of the line beam B10 can be adjusted dynamically according to various situations.

It should be noted that, for example, in the case where the light intensity of the line beam B10 is fixed in the intensity distribution shown in FIG. 7, the light intensity of the line beam B10 may be caused to be different in the long side direction by causing the emission abilities of the plurality of laser diodes 110 to be different as shown in FIG. 8A, or the adjusting lens 16 may be configured to cause the light intensity in the long side direction of the line beam B10 to be different in the long side direction as shown in FIG. 8B.

<Modifications>

Although the embodiment of the present invention has been described above, the present invention is not limited to the above embodiment, and various other modifications may be made.

For example, in the above embodiment, the light source is configured such that the plurality of light emitting portions 117 are aligned in the slow axis direction as shown in FIG. 2C, but the light source 11 may further be configured such that light emitting portions 117 are also aligned in the fast axis direction.

Figure 12A:
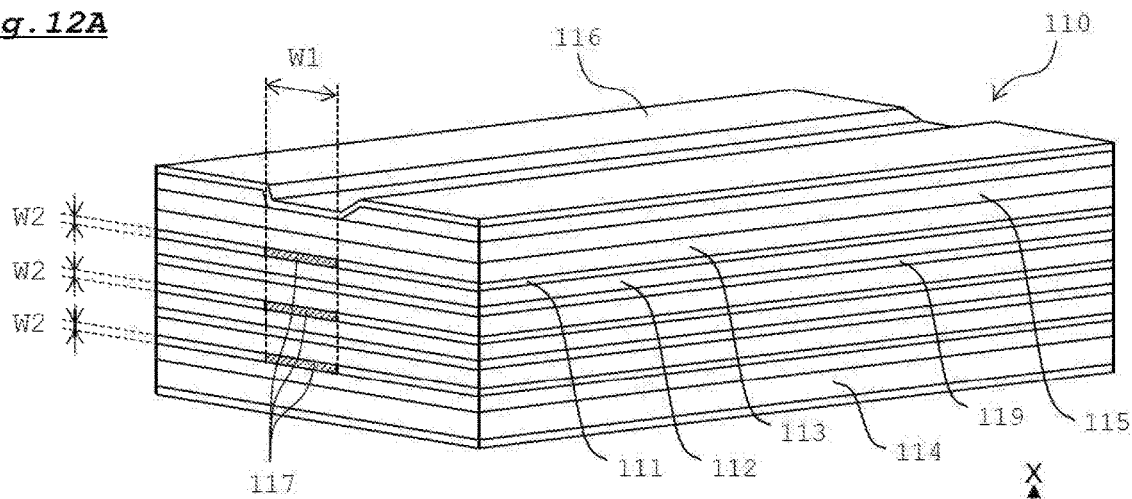
FIG. 12A and FIG. 12B are each a perspective view showing the configuration of a laser diode according to a modification.
Figure 12B:
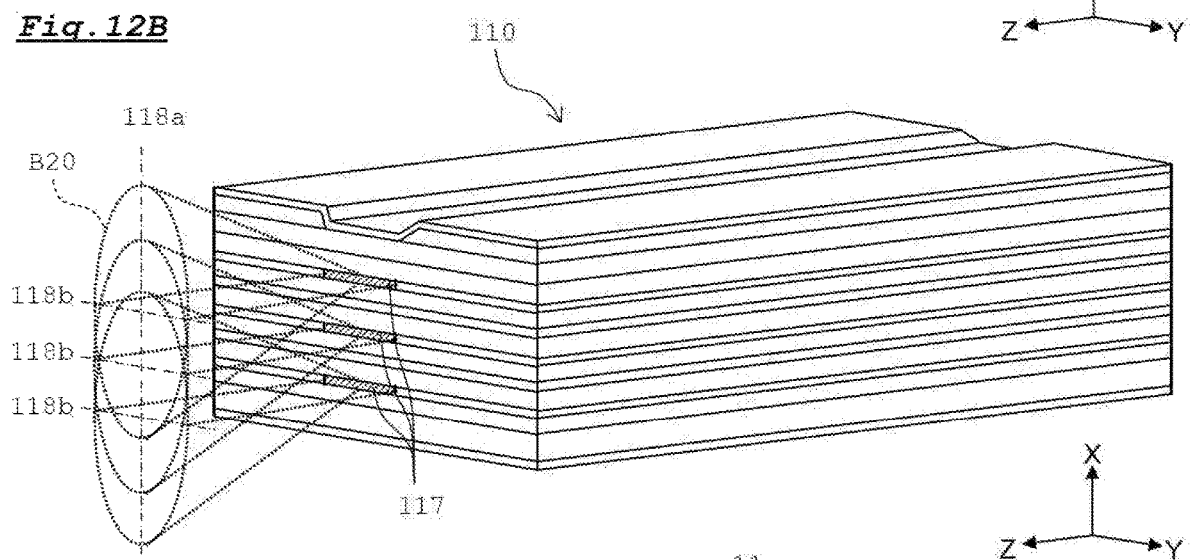
Figure 12C:
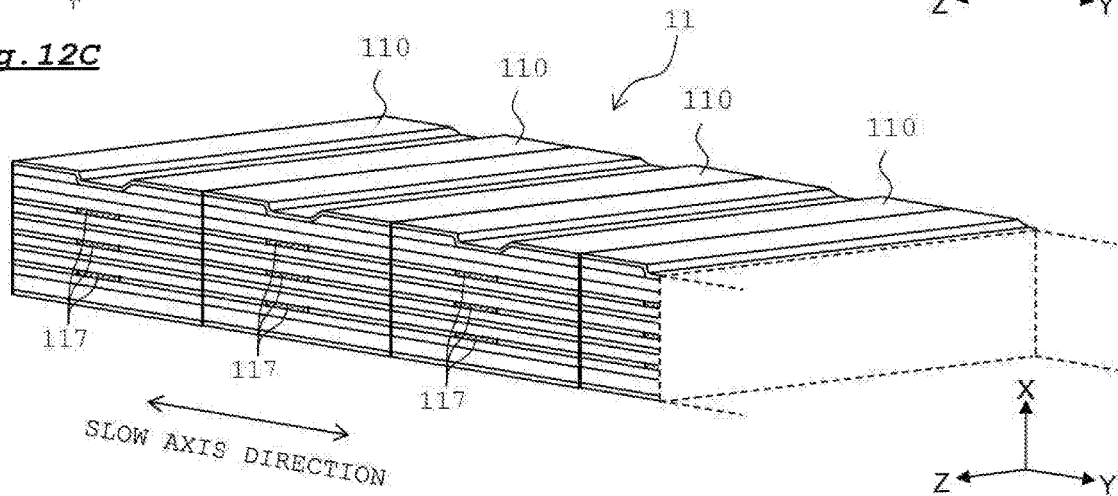
FIG. 12C is a perspective view showing the configuration of a light source of the laser radar according to the modification.

FIG. 12A to FIG. 12C are diagrams showing a configuration example in this case.

In this configuration example, as shown in FIG. 12A, a plurality of light emitting portions 117 are provided in one laser diode 110 so as to be aligned in the fast axis direction (X-axis direction). Sets of the active layer 111, the N-type clad layer 112, and the P-type clad layer 113 are laminated between the N-type substrate 114 and the contact layer 115 with tunnel junction layers 119 interposed between the sets. Accordingly, three light emitting portions 117 are formed.

Similar to the case of FIG. 2A, in each light emitting portion 117, the width W1 in the direction parallel to the active layer 111 is larger than the width W2 in the direction perpendicular to the active layer 111. By applying a drive current to the electrode 116, laser light is emitted from each of the three light emitting portions 117 as shown in FIG. 12B. The beam B20 has a spread angle in a direction parallel to the fast axis 118a larger than that in a direction parallel to the slow axis 118b. Thus, the beam B20 has an elliptical shape that is long in the fast axis direction.

In this configuration example, the light source 11 is configured such that a plurality of laser diodes 110 are disposed so as to be aligned in the slow axis direction as shown in FIG. 12C. Accordingly, a plurality of light emitting portions 117 are disposed so as to be aligned not only in the slow axis direction but also in the fast axis direction.

In this configuration example, since the number of light emitting portions 117 is increased as compared to that in the configuration of FIG. 2C, the light quantity of the line beam B10 can be increased. However, since the positions of the upper and lower light emitting portions 117 are displaced with respect to the optical axis of the collimator lens 12, the laser light emitted from these light emitting portions 117 is likely to spread from parallel light. Therefore, in this configuration, the intervals between the light emitting portions 117 aligned in the fast axis direction are preferably made as narrow as possible. According to the verification results in FIG. 5B, it can be said that the interval between the uppermost light emitting portion 117 and the lowermost light emitting portion 117 is preferably 240 µm or less. The number of light emitting portions 117 aligned in the fast axis direction is not limited to three, and may be another number such as two.

In this configuration example as well, the light intensity of the line beam B10 may be caused to be different in the long side direction by a method that is the same as the method described with reference to FIG. 6A to FIG. 11.

Moreover, in the above embodiment, the laser light is converted into parallel light using the two collimator lenses 12 and 13. However, the laser light may be converted into parallel light using one collimator lens having the functions of both collimator lenses 12 and 13. Furthermore, in the optical system shown in FIG. 1, the laser light is guided to the scanner 15 by the mirror 14. However, the mirror 14 may be omitted, and the laser light that has passed through the collimator lens 13 may be directly incident on the scanner 15. In addition, the configuration of the optical system that generates the line beam B10 can be changed as appropriate.

Moreover, in the above embodiment, each laser diode 110 is disposed such that the fast axis 118a of the light emitting portion 117 of the laser diode 110 is parallel to the direction (X-axis direction) corresponding to the short side direction of the line beam B10. However, the fast axis 118a of the light emitting portion 117 does not have to be strictly parallel to the direction corresponding to the short side direction of the line beam B10, and may be slightly tilted from a state of being parallel to the direction corresponding to the short side direction of the line beam B10.

Moreover, in the above embodiment, the laser radar 10 is mounted on the vehicle 20. However, the laser radar 10 may be mounted on another moving body. Furthermore, the laser radar 10 may be mounted on equipment or a facility other than the moving body.

In addition to the above, various modifications can be made as appropriate to the embodiments of the present invention, without departing from the scope of the technological idea defined by the claims.

What is claimed is:

1. A laser radar comprising:
a laser diode;
an optical system configured to shape laser light emitted from the laser diode, into a line beam that is long in one direction, and project the line beam; and
a scanner configured to perform scanning with the line beam in a short side direction of the line beam, wherein
the laser diode is disposed such that a fast axis of the laser diode extends along a direction corresponding to the short side direction,
the optical system includes a magnifying lens configured to spread the laser light emitted from the laser diode, in a direction corresponding to a long side direction of the line beam,
the scanner is disposed on a laser diode side with respect to the magnifying lens, and
the optical system includes an adjusting lens configured to adjust light intensity in the long side direction of the line beam.

2. The laser radar according to claim 1, wherein a plurality of light emitting portions for the laser light are disposed along a slow axis direction of the laser diode.

3. The laser radar according to claim 2, wherein a plurality of the laser diodes are disposed so as to be aligned along the slow axis direction.

4. The laser radar according to claim 1, wherein, when a divergence angle in a fast axis direction of the laser light before passing through the optical system is denoted by $\theta 0$, and a divergence angle in the fast axis direction of the laser light after passing through the optical system is denoted by $\theta 1$, $\theta 1/\theta 0$ is 0.1 or less.

5. The laser radar according to claim 1, wherein a width of a light emitting portion of the laser diode in the fast axis direction is 240 µm or less.

6. The laser radar according to claim 1, wherein
the magnifying lens has a lens surface curved only in one direction, and
the scanner performs scanning with the laser light in a direction parallel to a generatrix of the lens surface, thereby performing scanning with the line beam in the short side direction.

7. The laser radar according to claim 1, wherein
the optical system includes a collimator lens, and
the scanner is disposed between the collimator lens and the magnifying lens.

* * * * *